(12) United States Patent
Weber et al.

(10) Patent No.: US 6,635,564 B1
(45) Date of Patent: Oct. 21, 2003

(54) SEMICONDUCTOR STRUCTURE AND METHOD OF FABRICATION INCLUDING FORMING ALUMINUM COLUMNS

(75) Inventors: Stefan Weber, Dresden (DE); Roy C. Iggulden, Newburgh, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 43 days.

(21) Appl. No.: 09/662,424

(22) Filed: Sep. 14, 2000

(51) Int. Cl.$^7$ .......................................... H01L 21/4763
(52) U.S. Cl. ..................... 438/637; 438/638; 438/641
(58) Field of Search .............................. 438/637, 638, 438/644

(56) References Cited

U.S. PATENT DOCUMENTS

| | | | |
|---|---|---|---|
| 5,981,382 A | * 11/1999 | Konecni et al. | ............ 438/646 |
| 6,107,182 A | * 8/2000 | Asahina et al. | ............. 438/618 |
| 6,117,769 A | * 9/2000 | Nogami et al. | ............. 438/653 |
| 6,218,302 B1 | * 4/2001 | Braeckelmann et al. | .... 438/637 |
| 6,303,486 B1 | * 10/2001 | Park | ........................... 438/618 |
| 6,373,135 B1 | * 4/2002 | Weber | ......................... 257/758 |

* cited by examiner

Primary Examiner—Olik Chaudhuri
Assistant Examiner—William M. Brewster
(74) Attorney, Agent, or Firm—Jackson Walker L.L.P.

(57) ABSTRACT

High aspect ratio vias formed in a first insulating layer covering a semiconductor substrate (body) are filled with conductors in a manner that both reduces the number of processing steps and allows an alignment tool (stepper) to align to alignment and overlay marks. Sidewalls and a bottom of each via are coated with a composite layer of titanium, titanium nitride, and a chemical vapor deposited seed layer of aluminum. A physical vapor deposited layer of aluminum is then formed while the structure is heated to about 400 degrees C. to completly fill the vias and to overfill same to form a blanket layer of aluminum above the first insulating layer (34). The blanket layer of aluminum is then patterned and portions not covered by the pattern are removed to result in columns of aluminum. A second insulating layer is then formed around the columns of aluminum. The ends of the columns at a top of the second insulating layer lie in a relatively common plane to which steppers can relatively easily align patterns.

7 Claims, 3 Drawing Sheets

SEMICONDUCTOR STRUCTURE AND METHOD OF FABRICATION INCLUDING FORMING ALUMINUM COLUMNS

CROSS-REFERENCE TO RELATED APPLICATIONS

This application is related to an application entitled "Improved Semiconductor Structure And Method Of Fabrication", Ser. No. 09/662,691 which is being filed concurrently with this application and in which there is a common assignee and one common inventor.

FIELD OF THE INVENTION

This invention relates to integrated circuits, and more particularly, to semiconductor structures such as Dynamic Random Access Memories (DRAMS) which use multiple level metallization through high aspect ratio vias through insulating layers.

BACKGROUND OF THE INVENTION

The feature size for semiconductor chips has been reduced from 0.50☐micron in 1993 to 0.18 micron in 1999 with a projected reduction in feature size to 0.10☐micron in 2002. The product that is driving the decrease in feature size is the DRAM chip. This trend in feature size reduction is leading to an increase of three times more information per $cm^2$. Different mask levels are needed for multilevel metal processes for DRAM or other similar devices. Each mask level must be aligned to the previous level to assure that all features are aligned properly one to the other. With feature sizes of <0.13☐micron in current use for memory devices, very small misalignments can cause catastrophic results.

Most advanced circuitry relies on alignment tools (steppers) to match the alignment and overlay marks of one level to the corresponding marks on the next layer. A stepper is an alignment tool that aligns and exposes one (or a small number) of die (chip) at a time. The tool "steps" to each subsequent die on the semiconductor body. Alignment and overlay marks are targets on the mask and semiconductor body used for correct alignment and overlay of a pattern on one layer to a pattern on the next layer. These marks are etched into their respective patterns and become a permanent part of the wafer. Alignment tools, typically, rely on light optics for feature sizes of 0.13 micron and larger. For products that use several conducting layers for interconnecting the device circuitry, typically, only the top conducting layer uses a relaxed feature size.

As photolithographic processes are developed to accommodate smaller line widths it becomes more difficult to fill the resulting high aspect ratio vias and trenches with a conductor. Some of the more advanced technologies are faced with the prospect of filling patterns with aspect ratios that may be as high as five. Current technologies are using the Chemical Vapor Deposition (CVD) of tungsten as the metallurgy of choice to fill the vias that connect to the device contacts. However, aluminum, when compared with tungsten, has a lower resistivity and a lower melting point, and becomes the metal of choice for the upper levels of metal on devices such as DRAMS. A heated substrate can be used to help fill high aspect ratio vias as long as the time and temperature of deposition are consistent with the thermal budget.

Previous attempts to use aluminum for high aspect ratio vias have shown that conventional aluminum processes would not fill these openings, thus there will be left behind voids which can result in reliability failures. If the voids are interconnected, contaminants can be trapped in them leading to damage of the underlying materials or to materials, which are subsequently formed on the surfaces of the conductive vias. This problem will most likely be manifested during a thermal cycle as the entrapped contaminants can be changed into gases.

Processes that use PVD or CVD for depositing a conductive material, such as aluminum, onto a hot substrate do not, necessarily, completely fill high aspect ratio vias. Also, the high substrate temperature results in the formation of a structure with very large grains. It has been demonstrated that aluminum layers deposited onto substrates heated to 400 degrees C. usually results in the formation of two or three vertical grain boundaries across the diameter of the via. The problem with very large grains is that the surface of the metallurgy becomes rough as extra atoms either pile up at a grain boundary to form a peak on the surface or diffuse away more rapidly at a grain boundary to leave a depression. The surface roughness produced by this phenomenon has a considerable impact on the alignment of masks needed to process additional layers.

Lithographic processes require that alignment marks be reflective (smooth) and provide good contrast compared to other features on the surface of the semiconductor body. Also, it is critical that the conductive material does not overlap the edges of the alignment and overlay marks. Conductor materials, which have rough surfaces and also overlap the edges of the alignment and overlay marks can result in misalignments when the automated alignment tools (steppers) are unable to successfully locate clear, sharp edges.

It is desirable to overcome these problems through the use of a process that provides relatively smooth, reflective surfaces with good contrast and the elimination of edge overlap.

SUMMARY OF THE INVENTION

The present invention is directed to a method for depositing aluminum layers onto a semiconductor body so that alignment marks are clearly visible when using automated steppers for alignment.

In a preferred embodiment the present invention is directed to a method of forming aluminum conductors through insulating layers above a semiconductor body by first forming a titanium layer over side walls and a bottom of a via. A layer of titanium nitride is then formed over the titanium. A nucleation (seed) layer of chemical vapor deposited aluminum (CVD) is then formed over the titanium nitride. A physical vapor deposited layer of aluminum is then formed over the CVD aluminum layer while heating the resulting structure at about 400 degrees C. so as to completely fill the vias and to over flow the vias and to form a blanket layer of aluminum on a top surface of the vias. The blanket layer of aluminum is then patterned and portions not covered by the pattern are removed to result in columns of aluminum. A second insulating layer is then formed around the columns of aluminum. The ends of the columns at a top of the second insulating layer lie in a relatively common plane to which steppers can relatively easily align patterns.

Viewed from a method aspect, the present invention is directed to a method of forming aluminum conductors over a semiconductor structure comprising a semiconductor body having defined therein and formed on a top surface thereof contact regions to which electrical contacts are to be made, a first plurality of electrical conductors which have first ends that contact the contact regions, which extend above the top surface of the semiconductor body and are electrically isolated from each other by portions of a first insulating layer, and which have second ends which are in an essentially common plane. The method comprises the steps of: forming a second insulating layer over the first insulating layer; forming vias through the second insulating layer with each via being in communication with one of the first plurality of electrical conductors; covering sidewalls and a bottom of each of the vias through the second insulating layer with a conductive layer; covering each conductive layer with a nucleation layer of chemical vapor deposited aluminum; overfilling each of the vias through the second insulating layer with physical vapor deposited aluminum deposited at a temperature below the melting point of aluminum but close enough such that aluminum fills the vias through the second insulating layer and forms a blanket layer of aluminum above a top surface of the second insulating layer; applying a patterning layer over the blanket layer of aluminum which leaves surface portions thereof uncovered; removing aluminum in the areas not covered by the patterning layer to leave columns of aluminum which extend into the vias of the second insulating layer; and forming a third insulating layer around the columns of aluminum.

Viewed from an apparatus aspect, the present invention is directed to a semiconductor structure comprising a semiconductor body, a first plurality of electrical conductors, first, second and third insulating layers, and a plurality of physical vapor deposited aluminum conductors. The semiconductor body has defined therein and formed on a top surface thereof contact regions to which electrical contacts are to be made. The first plurality of electrical conductors have first ends that contact the contact regions and extend above the top surface of the semiconductor body and are electrical isolated from each other by portions of a first insulating layer. They have second ends which are in an essentially common plane. The second insulating layer overlying the first insulating layer and defining a plurality of vias therethrough. A bottom portion of each of the vias through the first insulating layer-is aligned to a second end of one of the first conductors. Sidewalls and the bottom portion of each via through the second insulating layer are lined with a conductive layer covered by a chemical vapor deposited nucleation layer of aluminum. The third insulating layer overlying the second insulating layer and defining a plurality of vias therethrough with each via being aligned to a bottom portion of a via through the second insulating layer. The plurality of physical vapor deposited aluminum conductors being deposited at a temperature below the melting point of aluminum but close enough such that the deposited aluminum flows, each of the physical vapor deposited aluminum conductors contacting the chemical vapor deposited aluminum layer at first ends thereof and filling the vias through the second insulating layer and having a second end thereof that extending through vias of the third insulating layer, the top surfaces of the second ends of the physical vapor deposited aluminum conductors lie in a relatively common plane.

The invention will be better understood from the following more detailed description taken in conjunction with the accompanying drawings and claims.

The drawings are not necessarily to scale.

DETAILED DESCRIPTION OF THE INVENTION

Figure 1:
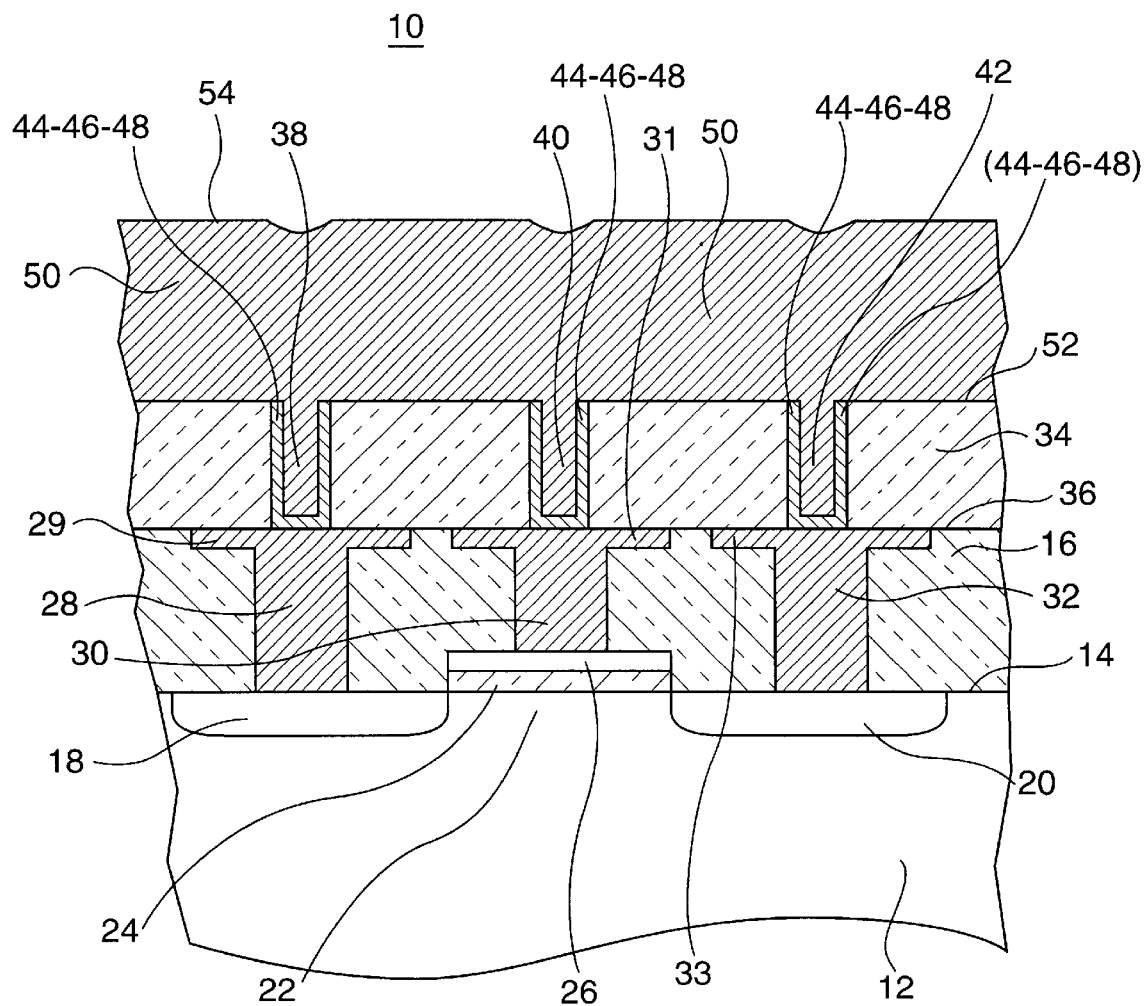
FIGS. 1 and 3 show a portion of a semiconductor structure at successive stages of processing in accordance with an exemplary embodiment of the present invention.

FIG. 1 shows a cross sectional view of a semiconductor structure 10 which comprises a semiconductor body (substrate) 12 having a top surface 14 with an insulating layer 16 formed thereover at one stage of processing in accordance with the present invention. An Insulated Gate Field Effect Transistor (IGFET) is formed in and over the top surface 14. The IGFET comprises a drain region 18 and a source region 20 that are formed in separated portions of semiconductor body 12. A channel region 22 of the transistor is the portion of body (substrate) 12 between the drain region 18 and the source region 20. A gate dielectric layer 24 is on the surface 14 and extends over the channel region 22. A gate region 26, typically, formed of doped polysilicon with a metal layer (not shown) thereabove, overlays a dielectric layer 24 and may be denoted as a gate stack.

Typically, the dielectric layer 24 and the gate region 26 are first formed with the gate region 26 serving as a mask, which allows for drain 18 and the source 20 to be self-aligned to the gate region 26. An insulating layer 16 is formed over surface 14 and gate region 26 and conventional photoprocessing is done to pattern layer 16 followed by etch processes to form vias (openings) 28, 30, and 32 through layer 16 to expose the drain and source regions 18 and 20 and the gate region 26, respectively, and to form trenches 29, 31, and 33 thereabove vias 28, 30, and 32, respectively.

A Damascene process, or a dual damascene process, is then used to over fill vias 28, 30, and 32 and trenches 29, 31, and 33 in layer 16 with a metal, typically tungsten (W). The surface is then planarized by Chemical Mechanical Polishing (CMP) to result in a planarized surface 36. An insulating layer 34, typically of $SiO_2$, is then deposited over the planarized surface 36. Layer 34 has a top surface 52.

Conventional photoresist and etching processes are used to form vias 38, 40, and 42 therethrough layer 34. These vias 38, 40, and 42 have in a preferred embodiment essentially vertical side walls but can have sloped side walls. The exposed surfaces of the vias 38, 40, and 42 are coated (lined), sequentially, with a layer 44 of titanium, a layer 46 of titanium nitride, and a nucleation (seed) layer 48 of aluminum. Only a single metal liner layer is shown in FIG. 1 with the reference number 44-46-48, but the three separate layers 44, 46, and 48 are shown in detail in FIG. 2.

Figure 2:
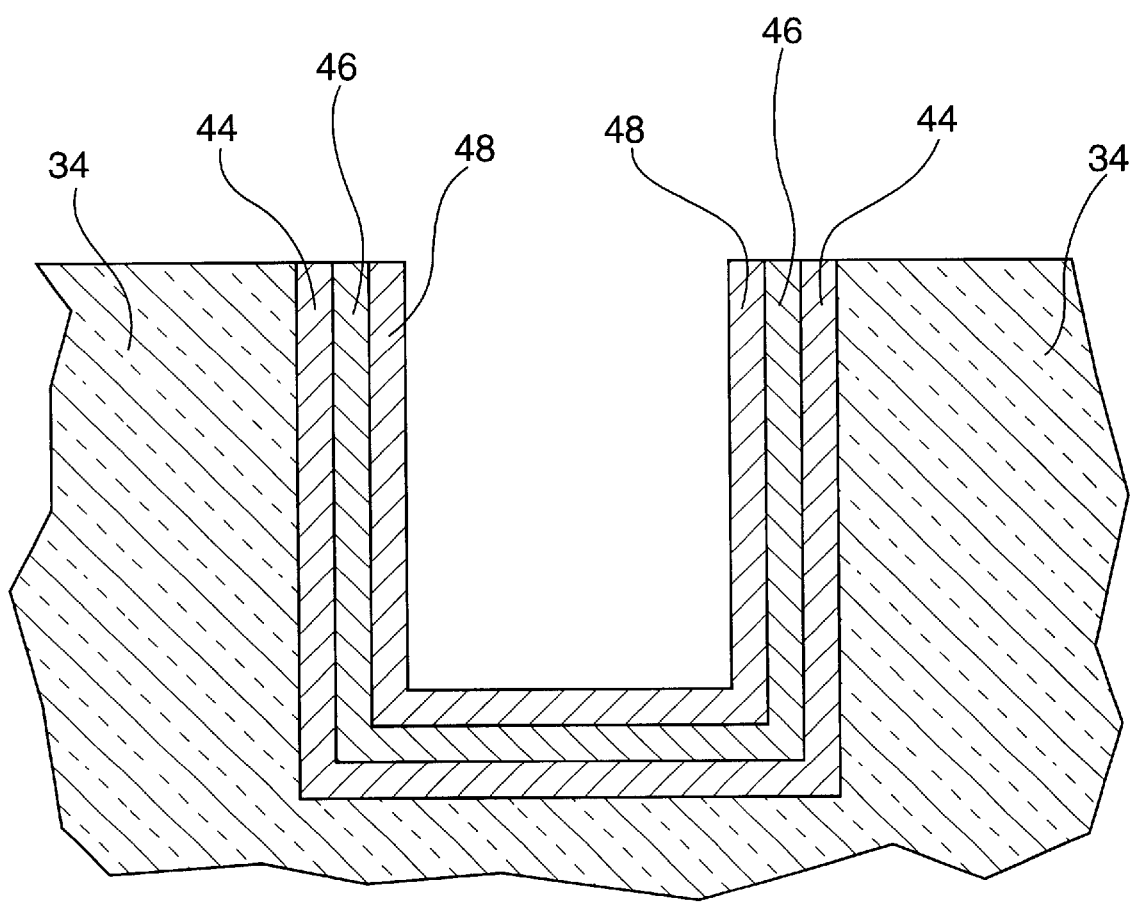
FIG. 2 shows an enlarged and detailed portion of the semiconductor structure of FIG. 1.

FIG. 2 shows an enlarged cross sectional view of one of the vias 38, 40, and 42 to show the three separate conducting layer 44, 46, and 48.

In an illustrative embodiment layer 44 is deposited in situ by an ionized Physical Vapor Depositon Porcess (PVD) layers 46 and 48 are deposited in situ by a Chemical Vapor Deposition (CVD) process. The vias 38, 40, and 42 are then filled and overfilled with aluminum to form a layer 50 which covers portions of top surface 52 of layer 34. Layer 50 is deposited by Physical Vapor Deposition (PVD) while structure 10 is heated, typically at 400 degrees C.

The aluminum seed layer 48 and the heated semiconductor structure 10 are needed to assure that the high aspect ratio vias are completely filled and free of voids. Portions of the aluminum layer 50 in the vias 38, 40, and 42 provides metal to metal contact therethrough the aluminum seed layer 48, the titanium nitride layer 46, and the titanium layer 44, to the tungsten metal filling vias 28, 30, and 32, respectively.

A top surface 54 of the aluminum layer 50 has a relatively planarized topography with shallow dips in the layer thickness located over and aligned with the vias 38, 40, and 42. The relative smoothness of top surface 54 of the layer 54 can be understood by considering that the temperature of the semiconductor structure 10 during this aluminum deposition is 400° C., which is greater than half the melting point of aluminum. This results in a high mobility for the aluminum atoms which allows the aluminum layer 50 to act somewhat like a liquid and thus help planarize top surface 54. Subsequent to the deposition of layer 50 the temperature is maintained at about 400 degrees C. to help planarize surface 54 and allow improved filling of any small cavities remaining in the vias 38, 40, and 42.

Typically, an anti-reflective coating (not shown) is used on the top surface 54 of the aluminum layer 50. This aids in the patterning of a photoresist layer (not shown), which is applied onto the top surface 54 of the aluminum layer 50.

Figure 3:
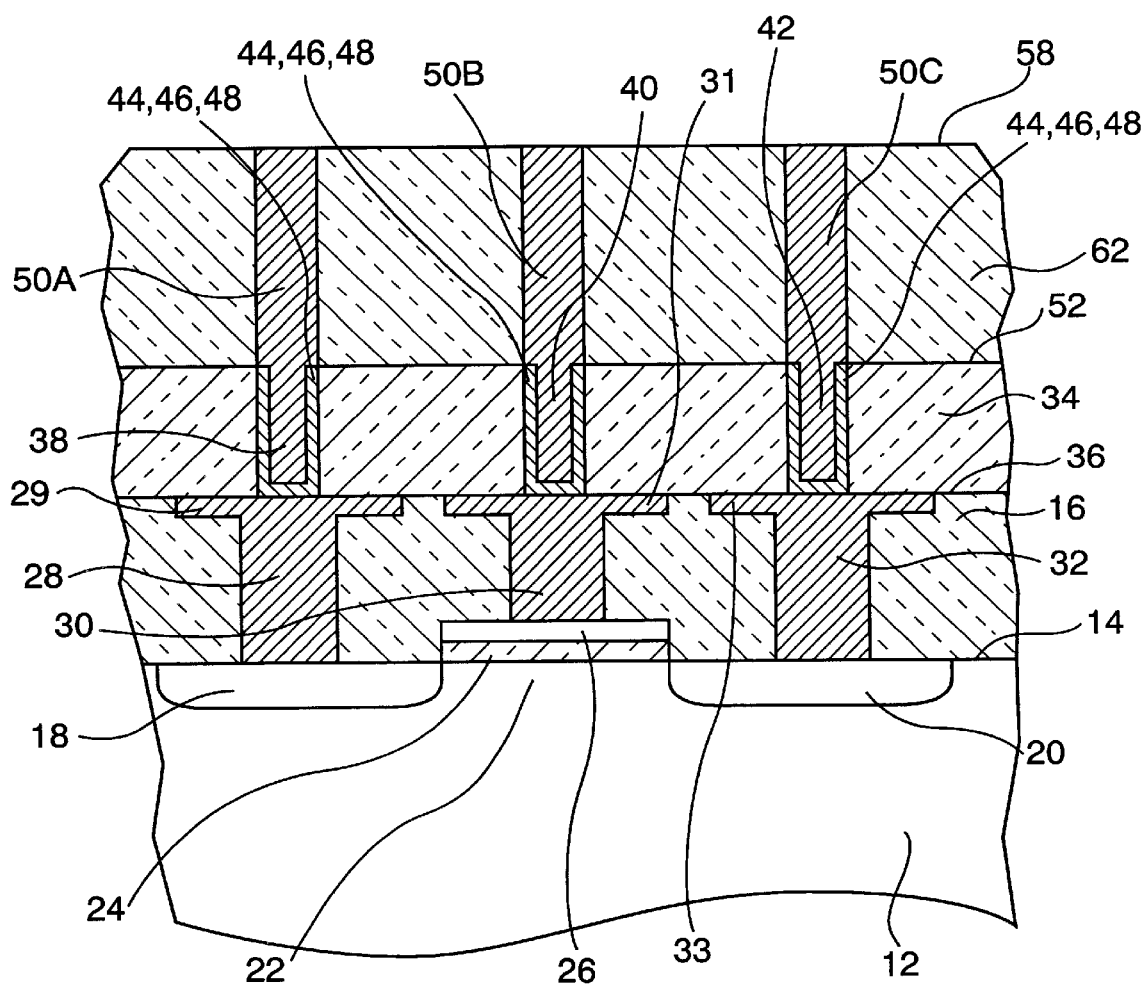

FIG. 3 shows a cross sectional view of a semiconductor structure 10 after additional processing with layer 50 having been etched using Reactively Ion Etching (RIE), which uses a patterned photoresist (not shown) layer as a mask, to form separated aluminum metal columns comprised of portions 50A, 50B, and 50C. The metal column comprising portion 50A extends into via 38, contacts layer 48, and is aligned over the metal filled via 28. The metal column comprising portion 50B extends into via 40, contacts layer 48, and is aligned to the metal filled via 30. The metal column comprising portion 50C extends into via 42, contacts layer 48, and is aligned to the metal filled via 32.

An insulating layer 62, typically SiO$_2$, is deposited onto the resulting structure to electrically isolate the metal columns comprised of 50A, 50B, and 50C from each other.

The resulting semiconductor structure is now ready for either: forming additional metal/insulator layers using the same or similar processes to the process delineated in the preferred embodiment or forming the terminal metallurgy (not shown), depending on the application.

It is to be noted that the specific embodiment that has been described is illustrative of the general principles of the invention. Various other embodiments can be devised without departing from the spirit and scope of the invention, for example, aluminum may be substituted for tungsten in the vias 28, 30, and 32 and TiN may be used as a first liner without a titanium liner thereunder.

What is claimed is:

1. A method of forming aluminum conductors over a semiconductor structure comprising a semiconductor body having defined therein and formed on a top surface thereof contact regions to which electrical contacts are to be made, a first plurality of electrical conductors which have first ends that contact the contact regions, which extend above the top surface of the semiconductor body and are electrically isolated from each other by portions of a first insulating layer, and which have second ends which are in an essentially common plane, the method comprising the steps of:

forming a second insulating layer over the first insulating layer;

forming vias through the second insulating layer with each via being in communication with one of the first plurality of electrical conductors;

covering sidewalls and a bottom of each of the vias through the second insulating layer with a conductive layer;

covering each conductive layer with a nucleation layer of chemical vapor deposited aluminum;

overfilling each of the vias through the second insulating layer with physical vapor deposited aluminum deposited at a temperature below the melting point of aluminum but close enough such that the deposited aluminum fills the vias through the second insulating layer and forms a blanket layer of aluminum above a top surface of the second insulating layer;

applying a patterning layer over the blanket layer of aluminum which leaves surface portions thereof uncovered;

removing aluminum in the areas not covered by the patterning layer to leave columns of aluminum which extend into the vias of the second insulating layer; and forming a third insulating layer around the columns of aluminum.

2. The method of claim 1 wherein the temperature at which the aluminum is deposited is about 400 degrees C.

3. The method of claim 1 wherein the conductive layer comprises titanium nitride.

4. The method of claim 3 wherein the conductive layer comprises a layer of titanium under the layer of titanium nitride.

5. The method of claim 1 wherein the first plurality of electrical conductors are formed of tungsten.

6. The method of claim 1 wherein each of the insulating layers is silicon oxide.

7. The method of claim 1, wherein said first-mentioned covering step includes covering the sidewalls and bottom of each via with first and second conductive layers.

* * * * *